(12) United States Patent
Kobayashi et al.

(10) Patent No.: US 6,649,981 B2
(45) Date of Patent: Nov. 18, 2003

(54) HIGH BREAKDOWN VOLTAGE SEMICONDUCTOR DEVICE

(75) Inventors: Motoshige Kobayashi, Hiratsuka (JP); Hideki Nozaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/107,405

(22) Filed: Mar. 28, 2002

(65) Prior Publication Data

US 2002/0140035 A1 Oct. 3, 2002

(30) Foreign Application Priority Data

Mar. 29, 2001 (JP) ........................................ 2001-095969

(51) Int. Cl.$^7$ .............................................. H01L 23/62
(52) U.S. Cl. ....................... 257/362; 257/565; 257/374; 257/330; 257/350
(58) Field of Search ................... 257/330, 350, 257/362, 374, 565; 438/138, 137, 294, 514, 515, 519, 522, 535

(56) References Cited

U.S. PATENT DOCUMENTS

2002/0127783 A1 * 9/2002 Otsuki et al. ............... 438/138

OTHER PUBLICATIONS

ASTM Document Summary F674–92, "Standard Practice for Preparing Silicon for Resistance Measurements," (1999).*

Gary McGuire, "Semiconductor Materials and Process Technology Handbook," Noyes Publ., Norwich, Nerw York, (1988), pp. 630–632.*

* cited by examiner

Primary Examiner—Tom Thomas
Assistant Examiner—Thomas Magee
(74) Attorney, Agent, or Firm—Oblon, Spivak, McClelland, Maier & Neustadt, P.C.

(57) ABSTRACT

A semiconductor device comprises a first base layer for providing a PT-IGBT or IEGT structure, which includes a buffer layer and a collector layer provided in the buffer layer. A first activation rate, defined by an activated first conductivity type impurity density [cm$^{-2}$] in the buffer layer due to SR analysis/a first conductivity type impurity density [cm$^{-2}$] in the buffer layer due to SIMS analysis is given by 25% or more, and a second activation rate, defined by an activated second conductivity type impurity density [cm$^{-2}$] in the collector layer due to SR analysis/a second conductivity type impurity density [cm$^{-2}$] in the collector layer duet to SIMS analysis is given by more than 0% and 10% or less.

4 Claims, 5 Drawing Sheets

VACC OF n-TYPE IMPURITY

HIGH BREAKDOWN VOLTAGE SEMICONDUCTOR DEVICE

CROSS-REFERENCE TO RELATED APPLICATIONS

This application is based upon and claims the benefit of priority from the prior Japanese Patent Application No. 2001-095969, filed Mar. 29, 2001, the entire contents of which are incorporated herein by reference.

BACKGROUND OF THE INVENTION

1. Field of the Invention

The present invention relates to a semiconductor device including a high breakdown voltage semiconductor device such as a punch-through type IGBT (PT-IGBT) and a method of manufacturing the same.

2. Description of the Related Art

An IGBT (Insulated Gate Bipolar Transistor) is known to the art as one of high breakdown voltage semiconductor devices. FIG. 5 is a cross sectional view showing a structure of a conventional punch-through type IGBT. As shown in the drawing, the IGBT comprises an n$^-$-type base layer 81. A p-type base layer 82 is formed in the n$^-$-type base layer 81. Also, an n-type emitter layer 83 is formed in the p-type base layer 82.

A gate electrode 85 is provided through a gate insulating film 84 on the p-type base layer 82 sandwiched between the n-type emitter layer 83 and the n$^-$-type base layer 81. The gate electrode 85 is formed of, for example, polycrystalline silicon (polysilicon).

An emitter electrode 86 is connected to the n-type emitter layer 83 and the p-type base layer 82 through contact holes formed in an interlayer insulating film 87. The emitter electrode 86 is formed of a metal such as Al. Further, the surface of the n$^-$-type base layer 81 including the gate electrode 85 and the emitter electrode 86 is covered with a passivation film (not shown).

On the other hand, a p$^+$-type collector layer 89 is formed on the back surface of the n$^-$-type base layer 81 through an n$^-$-type buffer layer 88. A collector electrode 90 is formed on the surface of the p$^+$-type collector layer 89. The collector electrode 90 is formed of a metal such as Al.

However, the PT-IGBT of this type gives rise to a serious problem as described in the following. Specifically, the PT-IGBT shown in FIG. 5 is manufactured by using a thick epitaxial wafer having the n$^+$-type buffer layer 88 and the n$^-$-type base layer 81 previously formed on the p$^+$-type collector layer 89.

To be more specific, the n$^+$-type buffer layer 88 having a thickness of 15 μm and the n$^-$-type base layer 81 having a thickness of 60 μm are successively formed by the epitaxial growth method on the p$^+$-type collector layer 89 having a thickness of 625 μm to form an epitaxial wafer having a thickness of 700 μm. Then, the back surface of the p$^+$-type collector layer 89 is polished to decrease the thickness of the p$^+$-type collector layer 89 to 175 μm, thereby using the epitaxial wafer as a substrate.

However, it is costly to prepare the epitaxial wafer having a thickness of 700 μm, with the result that the PT-IGBT shown in FIG. 5 is rendered costly.

In order to overcome the problem pointed out above, the present inventors have taken it into consideration to use an ordinary wafer in which the n$^+$-type buffer layer 88 and the p$^+$-type collector layer 89 are not formed therein in advance.

To be more specific, the inventors tried to use the ordinary wafer prepared by the method which includes successively forming the p-type base layer 82, the n-type emitter layer 83, the gate insulating film 84, the gate electrode 85, the interlayer insulating film 87, the emitter electrode 86, and a passivation layer (not shown) on the surface of a wafer in the order mentioned, successively implanting n-type impurity ions and p-type impurity ions into the back surface of the n$^-$-type base layer 81, and irradiating the back surface of the n$^-$-type base layer 81 with a laser beam for activating these n-type and p-type impurities thereby to form the n$^+$-type buffer layer 88 and the p$^+$-type collector 89.

However, since the melting depth achieved by the laser irradiation (laser annealing) of this kind is only several microns, and the irradiation time is short, the heat generated by the laser irradiation is not sufficiently transmitted into the n$^+$-type buffer layer 88 so as to cause a damage layer derived from, for example, the ion implantation to remain in the n$^+$-type buffer layer 88. As a result, the saturation voltage between the collector and the emitter ($V_{CE}$ (sat)) is increased under the on-state of the device, and the lowering of the characteristics that the leak current is generated takes place under the off-state of the device.

The saturation voltage $V_{CE}$ (sat) is increased because the damaged layer acts as a trap of the injected holes. On the other hand, the leak current is generated because, if the damaged layer 91 is depleted, the damaged layer 91 acts as the generation center of the carrier under the off-state, as shown in FIG. 6.

As a technique for eliminating the problem derived from the presence of the residual damaged layer, it is considered effective to decrease the acceleration energy of the n-type impurity implanted into the n$^+$-type buffer layer 88 because the activation rate of the n-type impurity is increased with decrease in the acceleration energy Vacc as shown in FIG. 7.

It should be noted that, if the acceleration energy of the n-type impurity is decreased, the depth of the n$^+$-type buffer layer 88 is decreased, with the result that the impurity concentration profile within the n$^+$-type buffer layer 88 is greatly affected by the diffusion of the p$^+$-type impurity to lower the controllability of the concentration profile.

If the controllability of the concentration profile is lowered, a serious problem is brought about as follows. Specifically, if the controllability of the concentration profile is lowered, it is rendered difficult or impossible to form the n$^+$-type buffer layer 88 and the p$^+$-type collector layer 89 each having a desired concentration profile. As a result, it is impossible to obtain desired device characteristics. Also, the devices are rendered different from each other in the concentration profile, leading to nonuniformity in the device characteristics.

At any rate, the n$^+$-type buffer layer and the p$^+$-type collector layer are formed by the ion implantation and the laser annealing in the conventional PT-IGBT of this type, with the result that the saturation voltage $V_{CE}$(sat) is increased and the controllability of the impurity concentration profile in the n$^+$-type buffer layer is lowered.

BRIEF SUMMARY OF THE INVENTION

According to a first aspect of the present invention, there is provided a semiconductor device, which comprises a first base layer having a first conductivity type, the base layer having first and second surfaces and further having a high resistance; a second base layer, provided in the first surface, having a second conductivity type; an emitter layer, provided in the second base layer, having the first conductivity type; a gate electrode provided through a gate insulating film over the second base layer disposed between the emitter layer and the first base layer; a buffer layer, formed in the second surface, having the first conductivity type and further having a high impurity concentration; a first activation rate, defined by an activated first conductivity type impurity density [$cm^{-2}$] in the buffer layer due to SR analysis/a first conductivity type impurity density [$cm^{-2}$] in the buffer layer due to SIMS analysis, being 25% or more; a collector layer, provided in the buffer layer, having the second conductivity type; and a second activation rate, defined by an activated second conductivity type impurity density [$cm^{-2}$] in the collector layer due to SR analysis/a second conductivity type impurity density [$cm^{-2}$] in the collector layer due to SIMS analysis, being more than 0% and 10% or less.

According to a second aspect of the present invention, there is provided a method of manufacturing a semiconductor device, which comprises preparing a first base layer having a first conductivity type and also having first and second surfaces each having a high resistance; successively forming an insulating film providing a gate insulating film and a conductive film providing a gate electrode on the first surface of the first base layer in the order mentioned; successively patterning the conductive film and the insulating film so as to expose partly the first surface; forming a second base layer having a second conductivity type in the exposed first surface by self-alignment; selectively forming an emitter layer having the first conductivity type in the second base layer; forming an emitter electrode on the emitter layer; implanting first impurity ions having the first conductivity type into the second surface of the first base layer; activating the first impurity ions by a first annealing treatment so as to form a buffer layer having a high impurity concentration and also having the first conductivity type on the second surface; implanting second impurity ions having the second conductivity type into a surface region of the buffer layer; and activating the second impurity ions by a second annealing treatment so as to form a collector layer having the second conductivity type in the buffer layer.

EMBODIMENT

An embodiment of the present invention will now be described with reference to the accompanying drawings.

FIGS. 1A to 1F are cross sectional views showing a method of making a PT-IGBT according to the embodiment of the present invention.

Figure 1A:
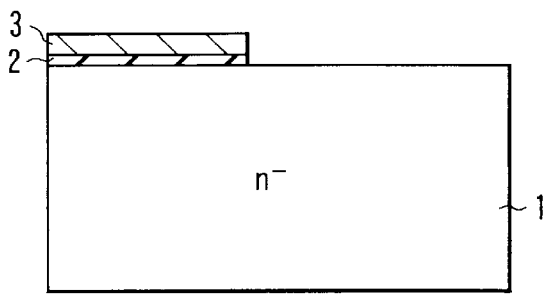
FIGS. 1A to 1F are cross sectional views showing a method of making a PT-IGBT according to one embodiment of the present invention.

In the first step, an insulating film providing a gate insulating film 2 and a conductive film providing a gate electrode 3 are successively deposited in the order mentioned on the surface of an $n^-$-type base layer 1, as shown in FIG. 1A. The gate insulating film 2 is formed of, for example, a silicon oxide film, and the gate electrode 3 is formed of, for example, polysilicon.

Figure 1B:
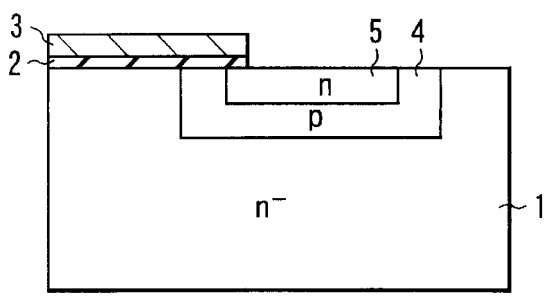

Then, a p-type base layer 4 is formed by self-alignment in the $n^-$-type base layer 1, followed by forming an n-type emitter layer 5 in the p-type base layer 4, as shown in FIG. 1B.

Figure 1C:
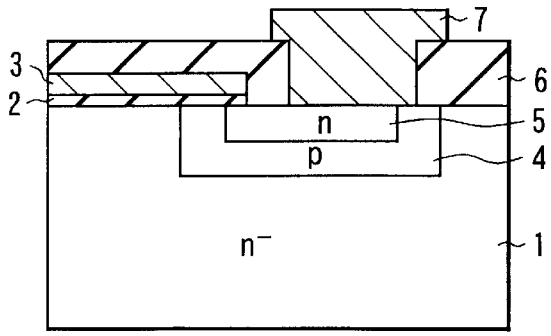

In the next step, an interlayer insulating film 6 is deposited on the entire surface, followed by forming a contact hole in the interlayer insulating film 6 and subsequently forming an emitter electrode 7 connected to the p-type base layer 4 and the n-type emitter layer 5, as shown in FIG. 1C. The emitter electrode 7 is made of, for example, Al. Incidentally, it is desirable to form the emitter electrode 7 through a barrier metal layer interposed between the emitter electrode 7 and the semiconductor layers including the p-type base layer 4 and the n-type emitter layer 5 in place of forming the emitter electrode 7 in direct contact with the p-type base layer 4 and the n-type emitter layer 5.

Further, the surface of the $n^-$-type base layer 1 including the gate electrode 3 and the emitter electrode 7 is covered with a passivation film (not shown), e.g., a polyimide film, and the thickness of the $n^-$-type base layer 1 is decreased in accordance with the specified breakdown voltage. The thickness of the $n^-$-type base layer 1 is decreased by polishing the back surface of the $n^-$-type base layer 1. The polishing is performed by, for example, CMP (Chemical Mechanical Polishing). It is also possible to decrease thickness of the $n^-$-type base layer 1 by a method employing both mechanical polishing and wet etching. In this case, the mechanical polishing is first carried out.

Figure 1D:
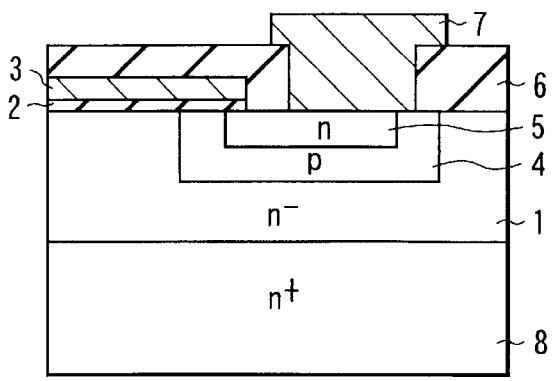

In the next step, an n-type impurity such as phosphorus is introduced into the back surface of the $n^-$-type base layer 1 by means of an ion implantation at a dose of, for example, $1 \times 10^{15}$ $cm^{-2}$ at an accelerating energy of 160 KeV, followed by irradiating the back surface of the $n^-$-type base layer 1 with an excimer laser under an energy density of, for example, 2.5 J/$cm^2$. Then, a laser annealing (first annealing) is applied so as to melt the region not deeper than 2 $\mu$m from the back surface of the $n^-$-type base layer 1, thereby forming an $n^+$-type buffer layer 8 on the back surface of the $n^-$-type base layer 1, as shown in FIG. 1D. The temperature for the laser annealing is not lower than the melting temperature of silicon, for example, not lower than 1,300° C.

The $n^+$-buffer layer 8 thus formed has an activation rate "a" (first activation rate) of 25% or more, and has a thickness of below 2 $\mu$m from the back surface of the $n^-$-type base layer 1. The back surface of the $n^-$-type base layer 1 provides the front surface of a $p^-$-type collector layer 9 in the process shown in FIG. 1F.

The activation rate "a" noted above is defined by P/Q, where P represents the density [$cm^{-2}$] of the n-type impurity in the $n^+$-type activated buffer layer obtained by the SR analysis, and Q represents the density [$cm^{-2}$] of the n-type impurity in the $n^+$-type buffer layer obtained by the SIMS analysis.

Briefly speaking, the SR analysis, which is known to the art, is as follows. Specifically, if a distance between two probes is sufficiently reduced (several 10 to several 100 $\mu$m) and the radius of each probe being in contact with a sample is given by "a", the relationship between the spread resistance Rs and the resistivity $\rho$ is given by: Rs=$\rho$/2a.

Figure 2:
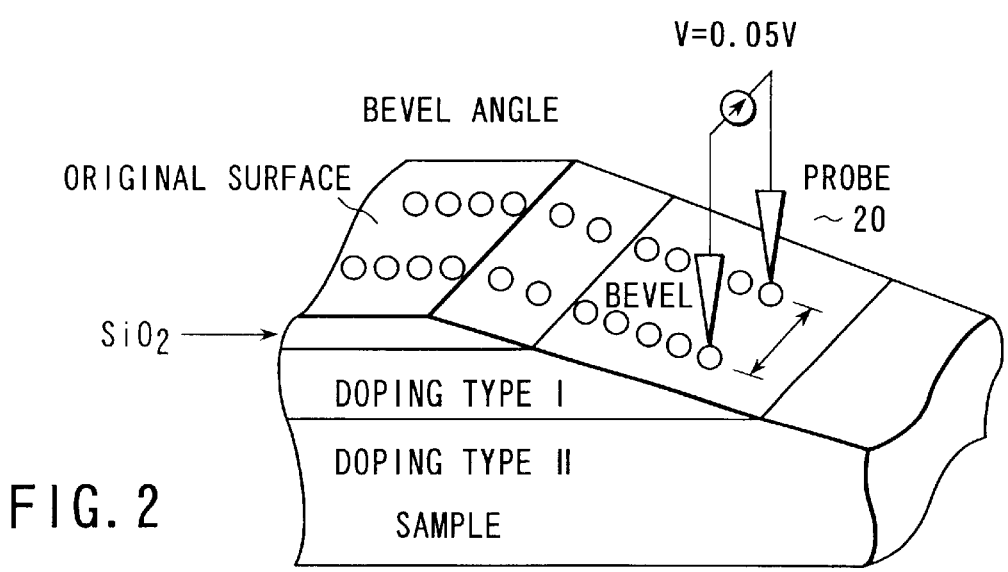
FIG. 2 is a drawing for explaining the SR analysis.

FIG. 2 shows the SR analysis, which is carried out, after a pn junction formed by an impurity diffusion is obliquely polished, the analysis is achieved by using an apparatus having the distance between the two probes of 20 μm. DOPING TYPE II shown in FIG. 2 corresponds to the $n^+$-type buffer layer 8, and DOPING TYPE I corresponds to the $p^+$-type collector layer 9 formed in the subsequent step.

Concerning the $n^+$-type buffer layer 8 formed as described above, the density [$cm^{-2}$] of the activated n-type impurity obtained by the SR analysis is $2.7 \times 10^{14}$ $cm^{-2}$, and the density [$cm^{-2}$] of the n-type impurity obtained by the SIMS analysis is $1 \times 10^{15}$ $cm^{-2}$. It follows that the activation rate "a" noted above is 25% or more, i.e., $a \geq 25\%$.

Figure 4:
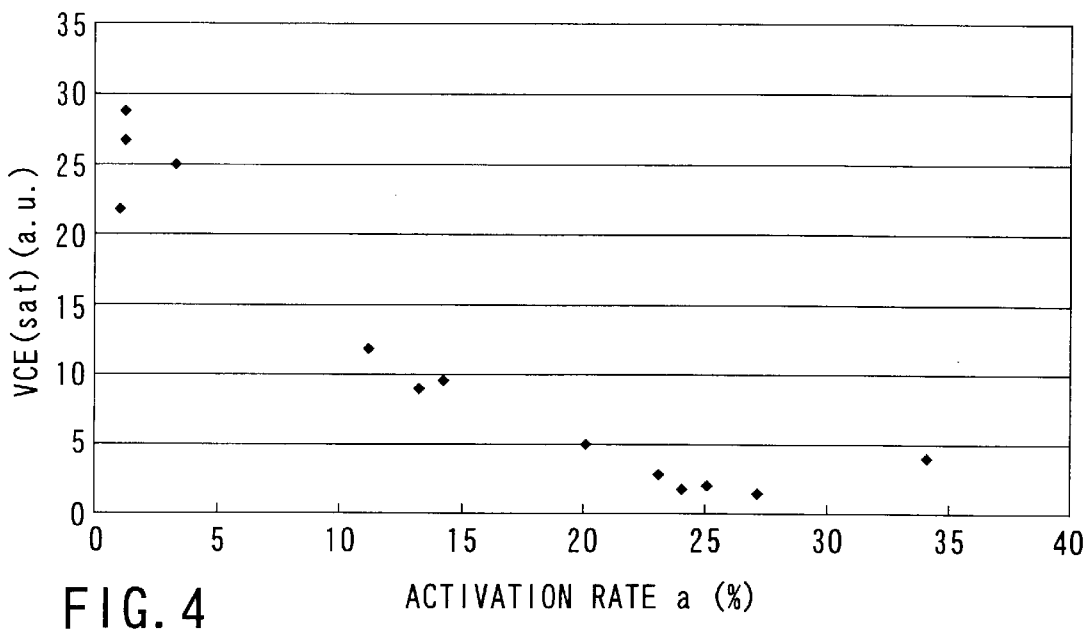
FIG. 4 is a graph showing the relationship between an activation rate "a" and $V_{CE}$(sat) of the $n^+$-type buffer layer.
Figure 5:
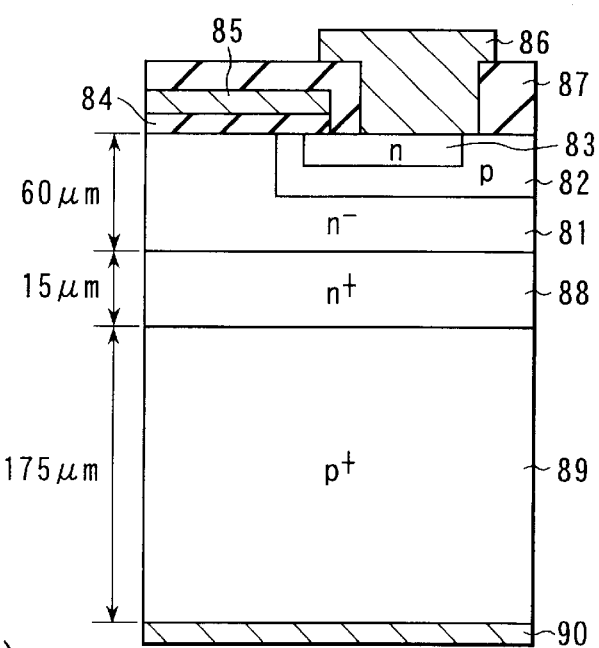
FIG. 5 is a cross sectional view showing a structure of a conventional PT-IGBT.
Figure 6:
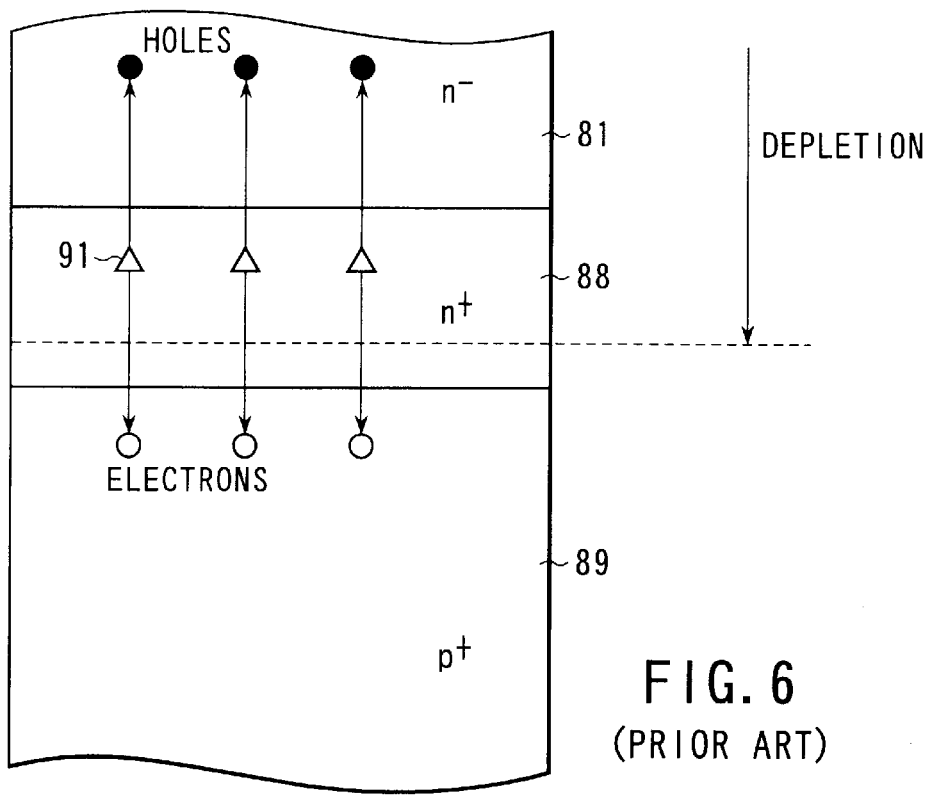
FIG. 6 is a drawing for explaining a mechanism of a leak current occurrence in the conventional PT-IGBT.
Figure 7:
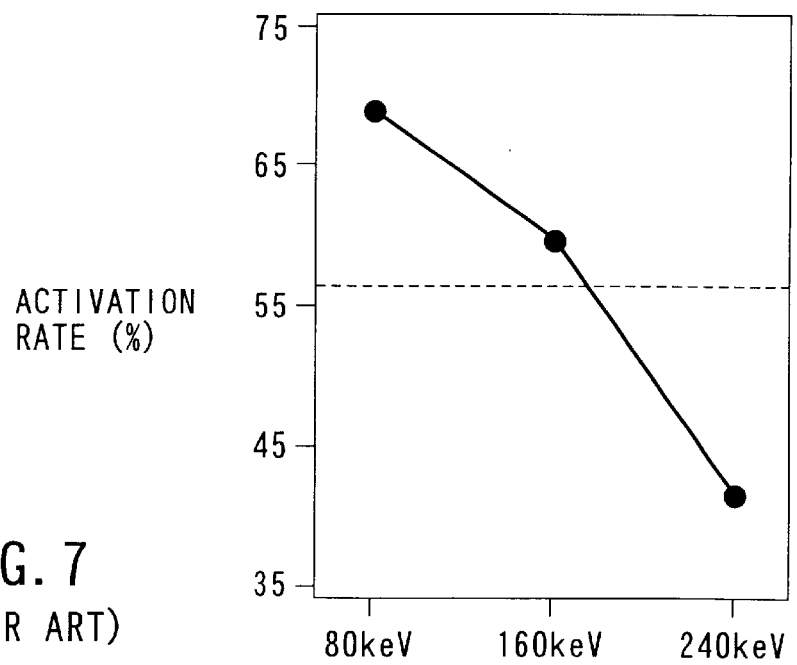
FIG. 7 is a graph showing the dependence on an accelerating energy of the activation rate of a first conductivity type impurity introduced by means of an ion implantation.

As shown in FIG. 4, the reason for setting the activation rate "a" to 25% or more is that VCE (sat) is sufficiently reduced when it exceeds 25% or more. It has also been found that the leak current is also reduced sufficiently in the region of $a \geq 25\%$.

Figure 1E:
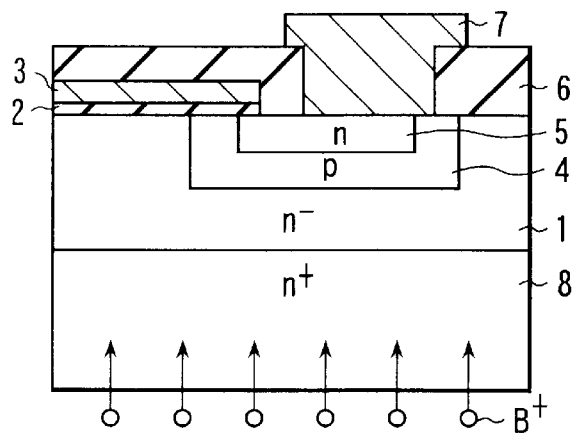

In the next step, boron ions ($B^+$) are implanted into the surface of the $n^+$-type buffer layer 8 at a dose of $1 \times 10^{15}$ $cm^{-2}$ at an accelerating energy of 50 KeV to provide a $p^+$-type collector layer 9 in the $n^+$-type buffer layer 8, as shown in FIG. 1E.

It is desirable that the implantation amount of boron is a value for rendering a part of the $p^+$-type collector layer 9 amorphous by the ion implantation of boron. It is the reason why the activation rate of the implanted boron ions is higher in the amorphous state, which is a continuous disorder, than that in the layer containing a partial disorder in the case where the annealing temperature is the same.

To be more specific, where the dose [$cm^{-2}$] of the p-type impurity in a region within 2 μm from the surface of the $p^+$-type collector layer 9 is $1 \times 10^{15}$ $cm^{-2}$, an activation rate "b" (second activation rate) after the sintering treatment at 450° C. is about 3%, and where the dose [$cm^{-2}$] noted above is $1 \times 10^{14}$ $cm^{-2}$, which is lower than the value noted above, the activation rate "b" is lower than 1%.

With respect to the $p^+$-type collector 9, where the dose [$cm^{-2}$] of the p-type impurity is $1 \times 10^{15}$ $cm^{-2}$, the density of the activated p-type impurity obtained by the SR analysis is $3 \times 10^{13}$ $cm^{-2}$, and the density of the p-type impurity obtained by the SIMS analysis is $1 \times 10^{15}$ $cm^{-2}$. These ratio, that is, the activation rate "b" is about 3%.

Also, where the dose [$cm^{-2}$] of the p-type impurity is $1 \times 10^{14}$ $cm^{-2}$, the density of the activated p-type impurity obtained by the SR analysis is $6 \times 10^{11}$ $cm^{-2}$, and the density of the p-type impurity obtained by the SIMS analysis is $1 \times 10^{14}$ $cm^{-2}$. It follows that the activation rate "b" is lower than 1%.

Further, the dose of boron capable of being amorphous is about $10^{15}$ $cm^{-2}$ or more.

Figure 1F:
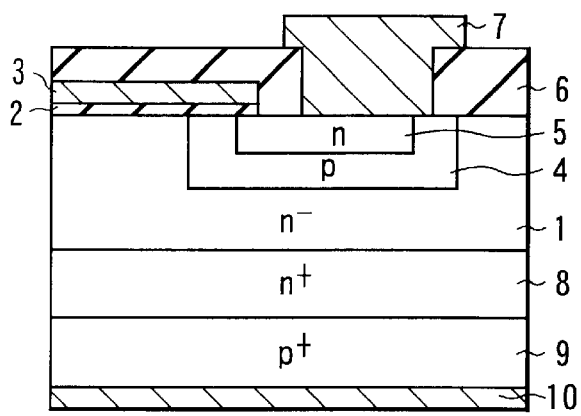

In the next step, a collector electrode 10 composed of an Al—Si material is deposited on the $p^+$-type collector layer 9 by sputtering using an Al—Si target prepared by adding Si to an Al body, followed by sintering the collector electrode 10 at 450° C. (second annealing), as shown in FIG. 1F. The sintering temperature is set at 450° C. in this case. However, the sintering temperature is not limited to 450° C. In other words, the upper limit of the temperature is determined by the material of the emitter electrode 7 and the material of the passivation film.

That is, it is necessary for the upper limit of the sintering temperature to be not higher than the melting point of the material of the emitter electrode 7 and to be not higher than the temperature at which the quality of the passivation film can be maintained. For example, where polyimide is used for forming the passivation film, the upper limit of the sintering temperature noted above is 560° C.

The sintering treatment also serves as the annealing for activating the boron ions implanted into the surface of the $n^+$-type buffer layer 8. It follows that the $p^+$-type collector layer 9 can be formed on the $n^+$-type buffer layer 8 without increasing the number of process steps. The sintering treatment noted above represents a heat treatment using an electric furnace (furnace annealing).

The activation rate of the boron ions achieved by the sintering treatment performed at 450° C. is less than 1%. In this case, if a part of the $p^+$-type collector layer 9 is rendered amorphous in the step of implanting boron ions shown in FIG. 1E, it is possible to expect that a higher activation rate can be achieved.

The $p^+$-type collector layer 9 is provided so that the activation rate "b" (second activation rate) is more than 0% and is less than 10%. The definition of the activation rate "b" is equal to that of the activation rate "a" given previously. To be more specific, the activation rate "b" is defined by X/Y, where X represents the density [$cm^{-2}$] of the p-type impurity in the activated $p^+$-type collector layer 9 obtained by the SR analysis, and Y represents the density [$cm^{-2}$] of the p-type impurity in the $p^+$-type collector layer 9 obtained by the SIMS analysis. The reason why the activation rate "b" falls within the range noted above, i.e., $0(\%) < "b" \leq 10(\%)$, is that the boron ions are activated by the sintering treatment.

Further, a V/Ni/Au electrode (not shown) is formed by the known method, followed by dicing.

Figure 3:
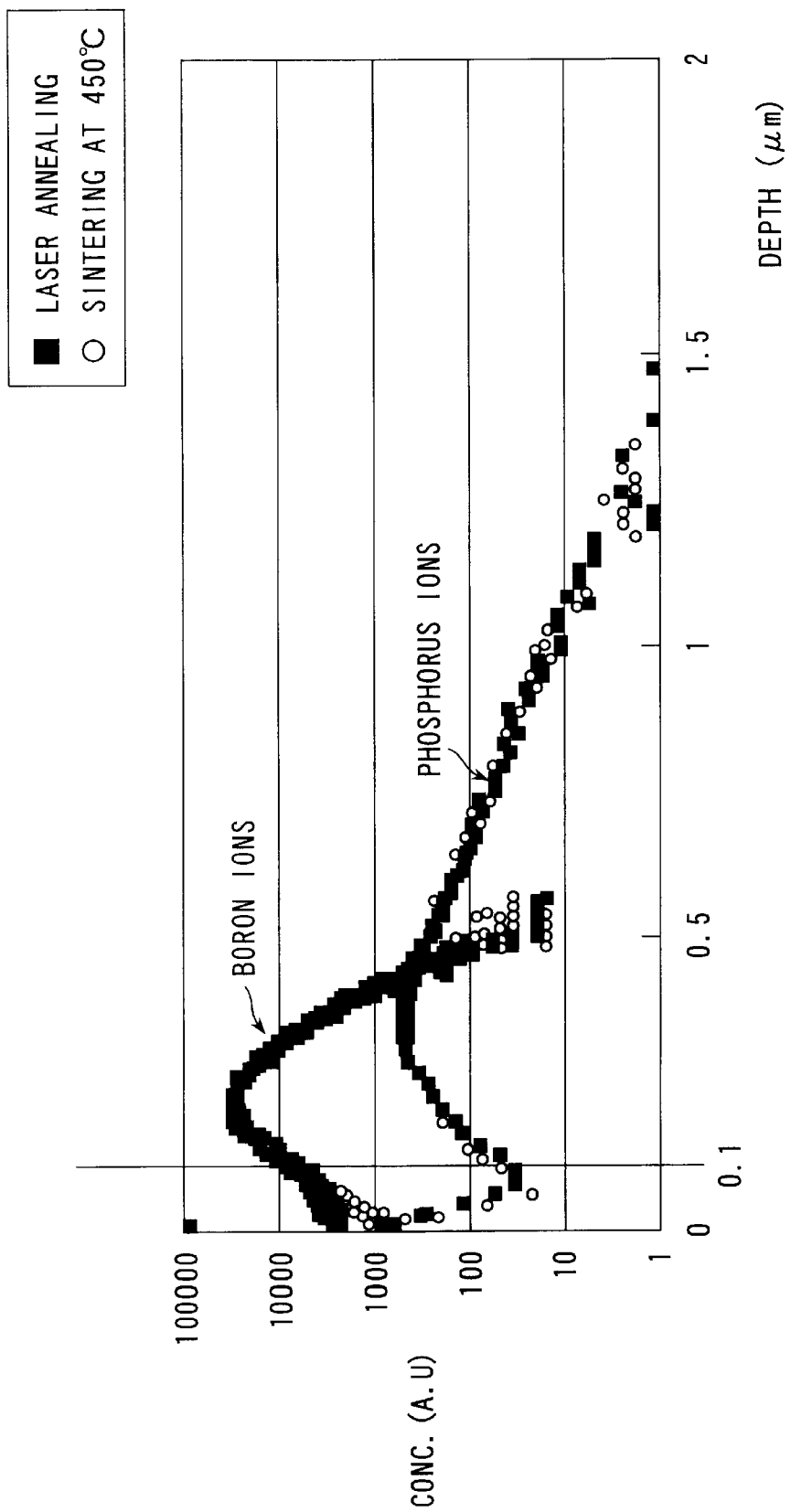
FIG. 3 is a graph showing the result of the SIMS analysis of the impurity concentration in each of the $n^+$-type buffer layer and the $p^+$-type collector layer in respect of the PT-IGBT.

FIG. 3 represents impurity concentration profiles showing the result of the SIMS analysis of the impurity concentration in each of the $n^+$-type buffer layer and the $p^+$-type collector layer in the case where the phosphorus and boron ions were activated by the sintering and in the case where the phosphorus and boron ions were activated by the laser annealing.

It will be apparent from FIG. 3 that boron ions are diffused into the region within 0.1 μm from the surface of the $p^+$-type collector layer in the case of the laser annealing and that the diffusion of boron ions scarcely takes place in the region within 0.1 μm from the surface of the $p^+$-type collector layer in the case of the sintering. That is, the impurity concentration distribution similar to Gaussian distribution can be achieved when the activation of boron ions is carried out by the sintering.

Accordingly, as described above, if the activation of phosphorus ions is carried out by the laser annealing to provide the relatively shallow $n^+$-type buffer layer, it can be possible to prevent sufficiently the boron contained in the $p^+$-type collector layer from being diffused into the $n^+$-type buffer layer since the boron ions are activated by the sintering. Therefore, it can be possible to prevent the controllability of the phosphorus concentration profile in the $n^+$-type buffer layer from being lowered.

To be more specific, the annealing for activating the ions of the first conductivity type impurity implanted into the base layer of the first conductivity type and the annealing for activating the ions of the second conductivity type impurity implanted into the buffer layer of the first conductivity type are separately carried out. That is, since the second annealing is carried out under the condition such that the second conductivity type impurity is scarcely diffused into the first conductivity type base layer, which does not result in the lowering of the device characteristics and the lowering of the controllability of the concentration profile, it can be possible to manufacture semiconductor devices including high breakdown voltage semiconductor devices such as PT-IGBTs capable of suppressing the lowering of the device characteristics and the lowering of the controllability of the impurity concentration profile. The condition noted above is that, for example, the second annealing temperature is lower than the first annealing temperature.

Further, by suppressing the lowering of the controllability in the concentration profile, eliminated are such conventional problems that desired device characteristic resulting in the lowering of the controllability are not obtained and that the device characteristics are varied corresponding to the devices.

It can be possible to obtain desired device characteristics since the $n^+$-type buffer layer and the $p^+$-type collector layer each having desired impurity concentration profile are provided.

In the embodiment described above, the second annealing temperature is made lower than the first annealing temperature in order to prevent the p-type impurity contained in the $p^+$-type collector layer from being diffused into the $n^+$-type buffer layer. Alternatively, it may be also possible to prevent the impurity diffusion noted above by controlling the annealing time or by controlling both the annealing temperature and the annealing time.

The present invention is not limited to the embodiment described above. For example, in the embodiment described above, the first conductivity type is the n-type, and the second conductivity type is the p-type. However, it may be possible to use the p-type as the first conductivity type, and to use the n-type as the second conductivity type.

More further, in the embodiment described above, the sintering process of the collector electrode 10 serves as the activation process of the boron ions in the $p^+$-type collector layer 9. However, it may be possible to carry out the sintering process of the collector electrode 10 and the activation process of the boron ions separately by different heat treatments. In this case, it is possible to optimize easily the conditions for each heat treatment.

Still further, in the embodiment described above, the discrete device of the PT-IGBT has explained. However, it may be possible to form the PT-IGBT and other circuits such as a control circuit and a protective circuit in the same chip.

Further, in the embodiment described above, the present invention may be applied to other high breakdown voltage semiconductor devices such as IEGTs (Injection Enhancement Gate Transistor). In other words, the present invention may be applied to a semiconductor device having a structure which includes a high resistivity base layer of a first conductivity type/a buffer layer of the first conductivity type having a high impurity concentration/a collector layer of a second conductivity type.

According to the embodiment of the present invention, the PT-IGBT is free from the problems such as the rise of the $V_{CE}$ (sat), the increase in the leak current, and the lowering in the controllability of the impurity concentration profile in the $n^+$-type buffer layer.

It should also be noted that the present invention makes it possible to provide a semiconductor device with a high breakdown voltage capable of suppressing the deterioration of device characteristics and the deterioration in the controllability of the impurity concentration profile and a method of making the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:

a first base layer having a first conductivity type, said first base layer having first and second surfaces and further having a high resistance;

a second base layer, provided in said first surface, having a second conductivity type;

an emitter layer, provided in said second base layer, having said first conductivity type;

a gate electrode provided through a gate insulating film over said second base layer disposed between said emitter layer and said first base layer;

a buffer layer, formed in said second surface, having said first conductivity type and further having a high impurity concentration;

a first activation rate, defined by an activated first conductivity type impurity density [$cm^{-2}$] in said buffer layer due to SR analysis/a first conductivity type impurity density [$cm^{-2}$] in said buffer layer due to SIMS analysis, being 25% or more;

a collector layer, provided in said buffer layer, having said second conductivity type; and a second activation rate, defined by an activated second conductivity type impurity density [$cm^{-2}$] in said collector layer due to SR analysis/a second conductivity type impurity density [$cm^{-2}$] in said collector layer due to SIMS analysis, being more than 0% and 10% or less.

2. The semiconductor device according to claim 1, wherein the dose of the second conductivity type impurity in said buffer layer positioned within 2 $\mu$m from the surface of said collector layer is $1 \times 10^{15}$ $cm^{-2}$ or more.

3. The semiconductor device according to claim 1, wherein said buffer layer is provided in said first base layer formed within 2 $\mu$m from the surface of said collector layer.

4. The semiconductor device according to claim 3, wherein the dose of the second conductivity type impurity in said buffer layer positioned within 2 $\mu$m from the surface of said collector layer is $1 \times 10^{15}$ $cm^{-2}$ or more.

* * * * *